United States Patent
Miyazoe et al.

(10) Patent No.: US 11,730,070 B2
(45) Date of Patent: Aug. 15, 2023

(54) RESISTIVE RANDOM-ACCESS MEMORY DEVICE WITH STEP HEIGHT DIFFERENCE

(71) Applicant: International Business Machines Corporation, Armonk, NY (US)

(72) Inventors: Hiroyuki Miyazoe, White Plains, NY (US); Seyoung Kim, White Plains, NY (US); Asit Ray, Baldwin Place, NY (US); Takashi Ando, Tuckahoe, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 528 days.

(21) Appl. No.: 16/286,912

(22) Filed: Feb. 27, 2019

(65) Prior Publication Data
US 2020/0274061 A1    Aug. 27, 2020

(51) Int. Cl.
*H10N 70/00*    (2023.01)
(52) U.S. Cl.
CPC ......... *H10N 70/841* (2023.02); *H10N 70/021* (2023.02); *H10N 70/8833* (2023.02)
(58) Field of Classification Search
CPC ......... H01L 45/1253; H01L 21/76802–76817; H01L 21/76877–76883; H10N 70/021; H10N 70/841; H10N 70/8833
See application file for complete search history.

(56) References Cited

U.S. PATENT DOCUMENTS

| | | | |
|---|---|---|---|
| 6,753,592 B1 * | 6/2004 | Husher | H01L 27/0623 257/E21.375 |
| 8,207,593 B2 | 6/2012 | Bratkovski et al. | |
| 8,283,649 B2 | 10/2012 | Bratkovski et al. | |
| 9,972,778 B2 | 5/2018 | Jo | |
| 9,985,203 B2 | 5/2018 | Chen et al. | |
| 9,997,703 B2 | 6/2018 | Lam et al. | |
| 2007/0034848 A1 | 2/2007 | Liu | |
| 2007/0164266 A1 * | 7/2007 | Choi | H01L 45/126 257/4 |
| 2011/0140068 A1 | 6/2011 | Ozawa et al. | |
| 2011/0278528 A1 | 11/2011 | Lung et al. | |
| 2012/0235112 A1 | 9/2012 | Huo et al. | |

(Continued)

OTHER PUBLICATIONS

Pan et al., "1Kbit FINFET Dielectric (FIND) RRAM in Pure 16nm FinFET CMOS Logic Process," IEEE International Electron Devices Meeting (IEDM), 2015, IEEE, 4 pages.

(Continued)

*Primary Examiner* — Matthew C Landau
*Assistant Examiner* — Mark Hatzilambrou
(74) *Attorney, Agent, or Firm* — Amin, Turocy & Watson, LLP

(57) ABSTRACT

Techniques facilitating resistive random-access memory device with step height difference are provided. A resistive random-access memory device can comprise a first electrode located within a trench of a dielectric layer. The resistive random-access memory device can also comprise a metal oxide layer comprising a first section located within the trench of the dielectric layer, and a second section located over the first electrode, and over a barrier metal layer. Further, the resistive random-access memory device can comprise a second electrode located over the metal oxide layer.

7 Claims, 14 Drawing Sheets

(56) References Cited

U.S. PATENT DOCUMENTS

| | | | |
|---|---|---|---|
| 2013/0320284 A1 | 12/2013 | Zhou et al. | |
| 2014/0131654 A1 | 5/2014 | Tu et al. | |
| 2015/0069315 A1 | 3/2015 | Shih et al. | |
| 2015/0069316 A1 | 3/2015 | Lee et al. | |
| 2016/0049583 A1* | 2/2016 | Huang | H01L 45/1273 257/4 |
| 2016/0079527 A1 | 3/2016 | Fest | |
| 2016/0181517 A1 | 6/2016 | Zhou et al. | |
| 2019/0157346 A1* | 5/2019 | Lee | H01L 45/16 |
| 2020/0136039 A1* | 4/2020 | Tsai | H01L 45/1253 |

OTHER PUBLICATIONS

Chuang et al., "Effects of Electric Fields on the Switching Properties Improvements of RRAM Device with a Field-Enhanced Elevated-Film-Stack Structure," IEEE Journal of the Electron Devices Society, 2018, pp. 622-626, vol. 6, 5 pages.

Liu et al., "Low-Power and Highly Uniform Switching in ZrO2-Based ReRAM With a Cu Nanocrystal Insertion Layer," IEEE Electron Device Letters, Nov. 2010, pp. 1299-1301, vol. 31, No. 11, IEEE, 3 pages.

Jana et al., "Rough surface improved formation-free low power resistive switching memory using IrOx/GdOx/W structure," International Symposium on VLSI Technology, Systems, and Applications (VLSI-TSA), 2013, IEEE, 2 pages.

Chien et al., "A Forming-free WOx Resistive Memory Using a Novel Self-aligned Field Enhancement Feature with Excellent Reliability and Scalability," IEEE International Electron Devices Meeting (IEDM), 2010, IEEE, 4 pages.

Baek et al., "Realization of Vertical Resistive Memory (VRRAM) using cost effective 3D Process," IEEE International Electron Devices Meeting (IEDM), 2011, pp. 737-740, IEEE, 4 pages.

* cited by examiner

RESISTIVE RANDOM-ACCESS MEMORY DEVICE WITH STEP HEIGHT DIFFERENCE

BACKGROUND

The subject disclosure relates to memory devices, and more specifically, resistive random-access memory devices.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, methods of fabrication, and/or structures that facilitate a resistive random-access memory device with step height difference are provided.

According to an embodiment, provided is a resistive random-access memory device structure that can comprise a first electrode located within a trench of a dielectric layer. The first electrode can comprise a recessed portion. Further, the resistive random-access memory device structure can comprise a metal oxide layer that can comprise a first section located within the recessed portion of the first electrode. The metal oxide layer can also comprise a second section located over the first electrode, and over a barrier metal layer. Further, the resistive random-access memory device structure can comprise a second electrode located over the metal oxide layer.

According to another embodiment, a method can comprise forming a first electrode within a trench of a dielectric layer, and recessing an area of the first electrode. The method can also comprise depositing a first portion of a metal oxide layer within the area of the first electrode and a second portion of the metal oxide layer over a barrier metal layer. Further, the method can comprise forming a second electrode adjacent the metal oxide layer.

According to a further embodiment, provided is a resistive random-access memory device that can comprise a first electrode located within a trench of a dielectric layer. The resistive random-access memory device can also comprise a metal oxide layer comprising a first section located within the trench of the dielectric layer, and a second section located over the first electrode, and over a barrier metal layer. Further, the resistive random-access memory device can comprise a second electrode located over the metal oxide layer.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

The disclosed aspects provide a resistive random-access memory device comprising a first electrode recessed from a level of an inter-layer dielectric (ILD). A metal oxide layer and a second electrode layer can be formed on the recessed portion of the first electrode. Further, cells of the resistive random-access memory device comprise corners, which can be preferential filament formation according to some implementations. For example, FIN corners can be utilized to enhance an electrical field to facilitate the electroforming of an oxide resistive random-access memory device. According to an implementation, the electrical field can be enhanced at the corners of the second electrode during an electroforming step. In some implementations, current conducting filaments can be formed. Advantages of the aspects discussed herein include a lower forming voltage, a lower device variability, and/or resistive random-access memory device cell area scaling.

Figure 1:
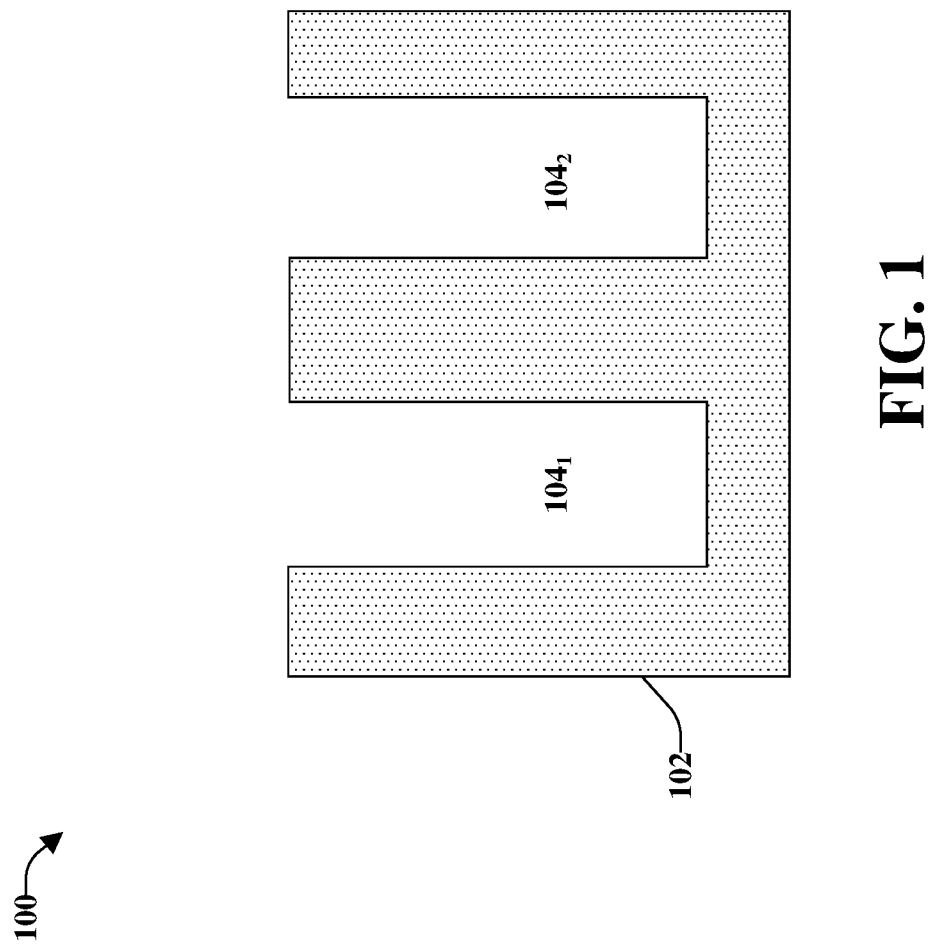
FIG. 1 illustrates an example, non-limiting, side cross-sectional view of a structure for an embodiment of resistive random-access memory device during a fabrication process wherein one or more metal line trenches are formed in accordance with one or more embodiments described herein.

FIG. 1 illustrates an example, non-limiting, side cross-sectional view of a structure for an embodiment of resistive random-access memory device 100 during a fabrication process wherein one or more metal line trenches are formed in accordance with one or more embodiments described herein.

A first dielectric layer 102, which can be a first inter-layer dielectric (ILD) layer, can be formed on a substrate (not shown). The substrate can be, for example, a semiconductor substrate. The first dielectric layer 102 can be formed from any suitable dielectric material. One or more trenches can be formed in the first dielectric layer 102. For example, illustrated are a first trench $104_1$ and a second trench $104_2$ formed in the first dielectric layer 102.

Figure 2:
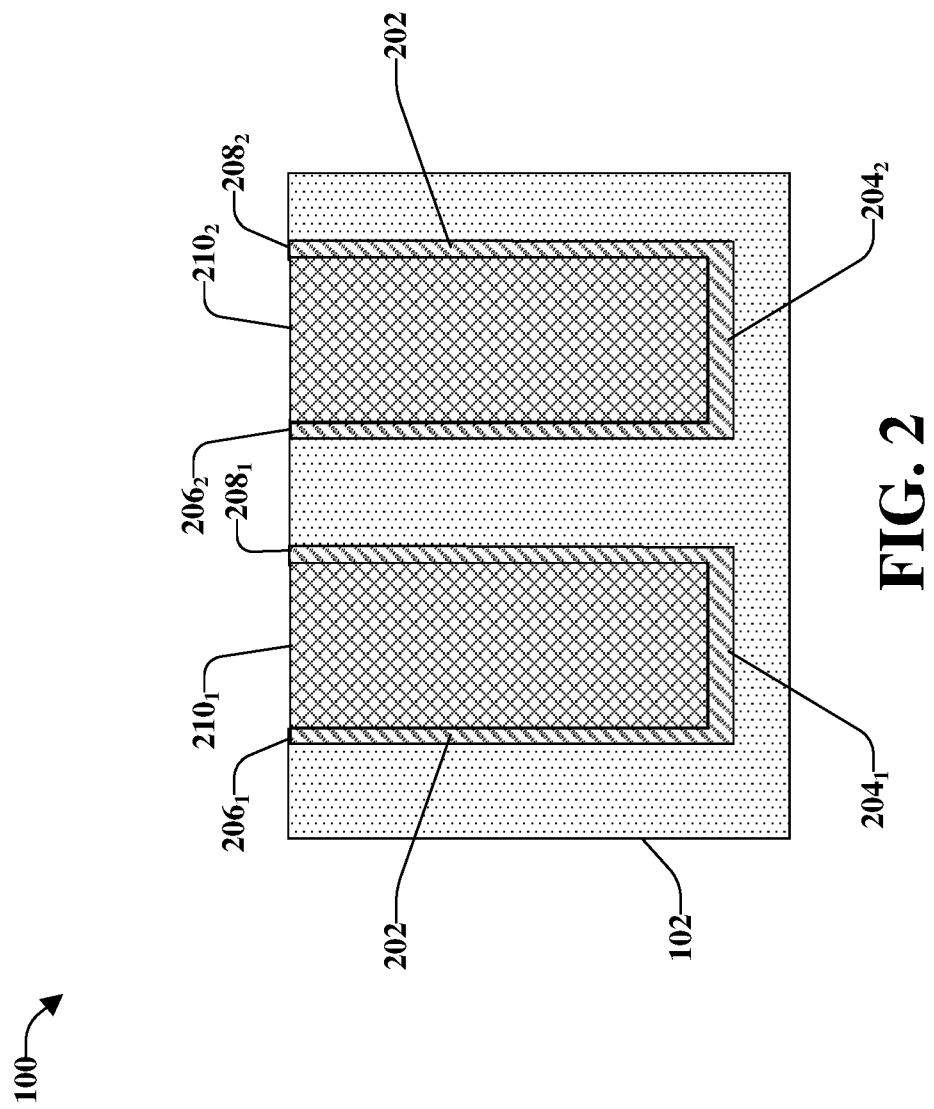
FIG. 2 illustrates an example, non-limiting, side cross-sectional view of the structure of the resistive random-access memory device of FIG. 1 during a fabrication process wherein a barrier metal is deposited, and one or more trenches are filled in accordance with one or more embodiments described herein.

FIG. 2 illustrates an example, non-limiting, side cross-sectional view of the structure of the resistive random-access memory device 100 of FIG. 1 during a fabrication process wherein a barrier metal is deposited, and the one or more trenches are filled in accordance with one or more embodiments described herein. Repetitive description of like elements employed in other embodiments described herein is omitted for sake of brevity.

A barrier metal layer 202 can be deposited within the one or more trenches (e.g., the first trench $104_1$ and the second trench $104_2$). For example, barrier metal of the barrier metal layer 202 can be deposited at respective bottom areas of the one or more trenches (e.g., the first trench $104_1$, the second trench $104_2$) and on respective sides of the one or more trenches. Thus, for the first trench $104_1$ the barrier metal layer 202 can be deposited at a bottom $204_1$, at a first side $206_1$, and at a second side $208_1$ of the first trench $104_1$. In a similar manner, the barrier metal layer 202 can be deposited at a bottom $204_2$, at a first side $206_2$, and at a second side $208_2$ of the second trench $104_2$. Accordingly, the barrier metal layer can operate as a liner for the one or more trenches (e.g., the first trench $104_1$, the second trench $104_2$). According to some implementations, the barrier metal layer 202 can comprise Tantalum Nitride (TaN) or bilayer of Tantalum (Ta) and Tantalum Nitride.

Further, the one or more trenches (e.g., the first trench $104_1$, the second trench $104_2$) can be filled with material to create respective metal lines. Thus, the first trench $104_1$ can be filled with material to create a first metal line $210_1$ and the second trench $104_2$ can be filled with material to create a second metal line $210_2$. According to some implementations, the material used to fill the one or more trenches (e.g., the first trench $104_1$, the second trench $104_2$) can comprise copper (Cu).

Upon or after the barrier metal layer 202 has been deposited and the one or more trenches have been filled with material to create the metal lines (the first metal line $210_1$, the second metal line $210_2$), a Chemical-Mechanical Polish (CMP) process (or similar process) can be performed as a step in the fabrication process. CMP is a polishing process that can be utilized to smooth surfaces. For example, CMP can utilize a chemical slurry formation and a mechanical polishing process to obtain the smooth surfaces. As illustrated, the CMP can create a level surface across respective surfaces of the first dielectric layer 102, the barrier metal layer 202, and first metal line $210_1$ and the second metal line $210_2$.

Figure 3:
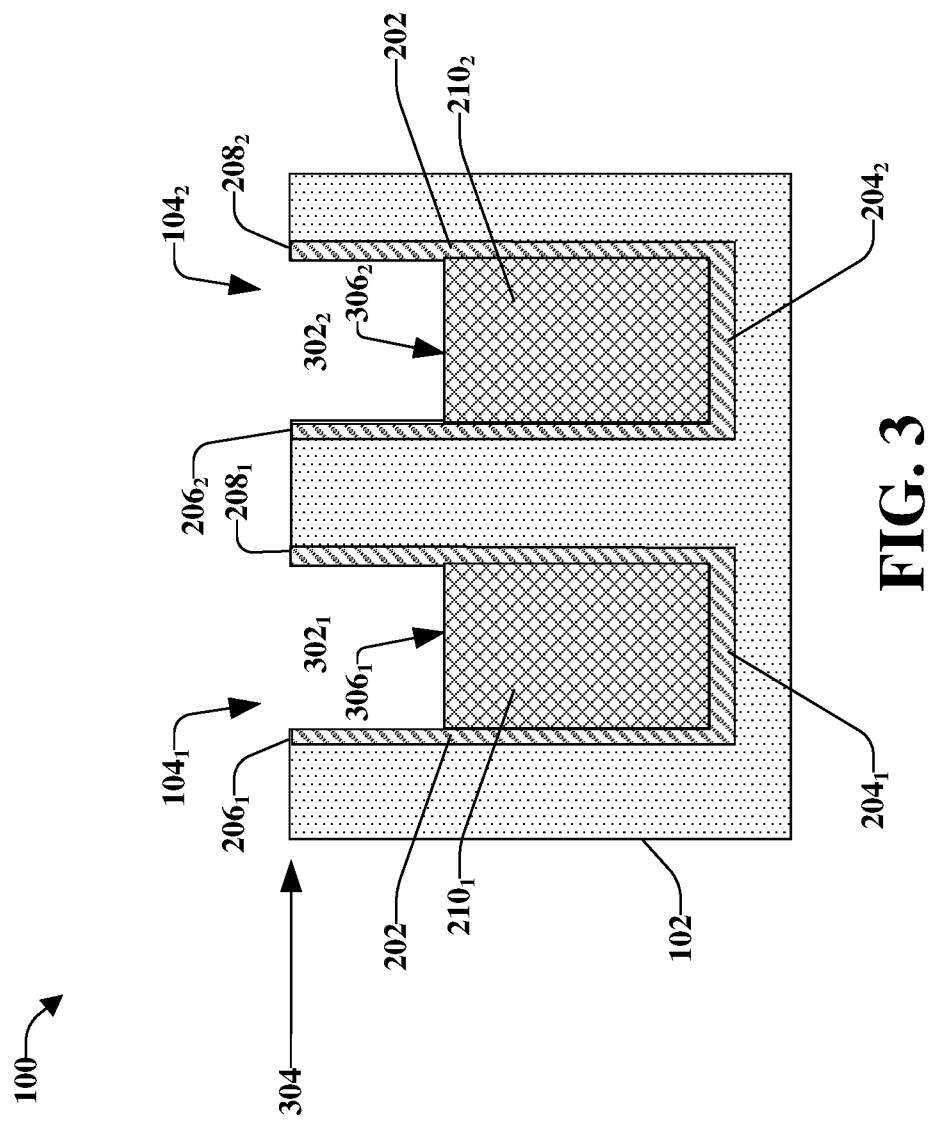
FIG. 3 illustrates an example, non-limiting, side cross-sectional view of the structure of the resistive random-access memory device of FIG. 2 during a fabrication process wherein metal lines formed in one or more trenches are recessed in accordance with one or more embodiments described herein.

FIG. 3 illustrates an example, non-limiting, side cross-sectional view of the structure of the resistive random-access memory device 100 of FIG. 2 during a fabrication process wherein metal lines formed in one or more trenches are recessed in accordance with one or more embodiments described herein. Repetitive description of like elements employed in other embodiments described herein is omitted for sake of brevity.

As illustrated, a first area $302_1$ of the first metal line $210_1$ and a second area $302_2$ of the second metal line $210_2$ can be recessed below a top surface of the resistive random-access memory device 100. Thus, material of the first metal line $210_1$ located between the top surface 304 of the resistive random-access memory device 100 and a first defined point $306_1$ (within the first trench $104_1$) can be removed, as indicated by the first area $302_1$. Further, material of the second metal line $210_2$ located between the top surface 304 of the resistive random-access memory device 100 and a second defined point $306_2$ (within the second trench $104_2$) can be removed, as indicated by the second area $302_2$.

Figure 4:
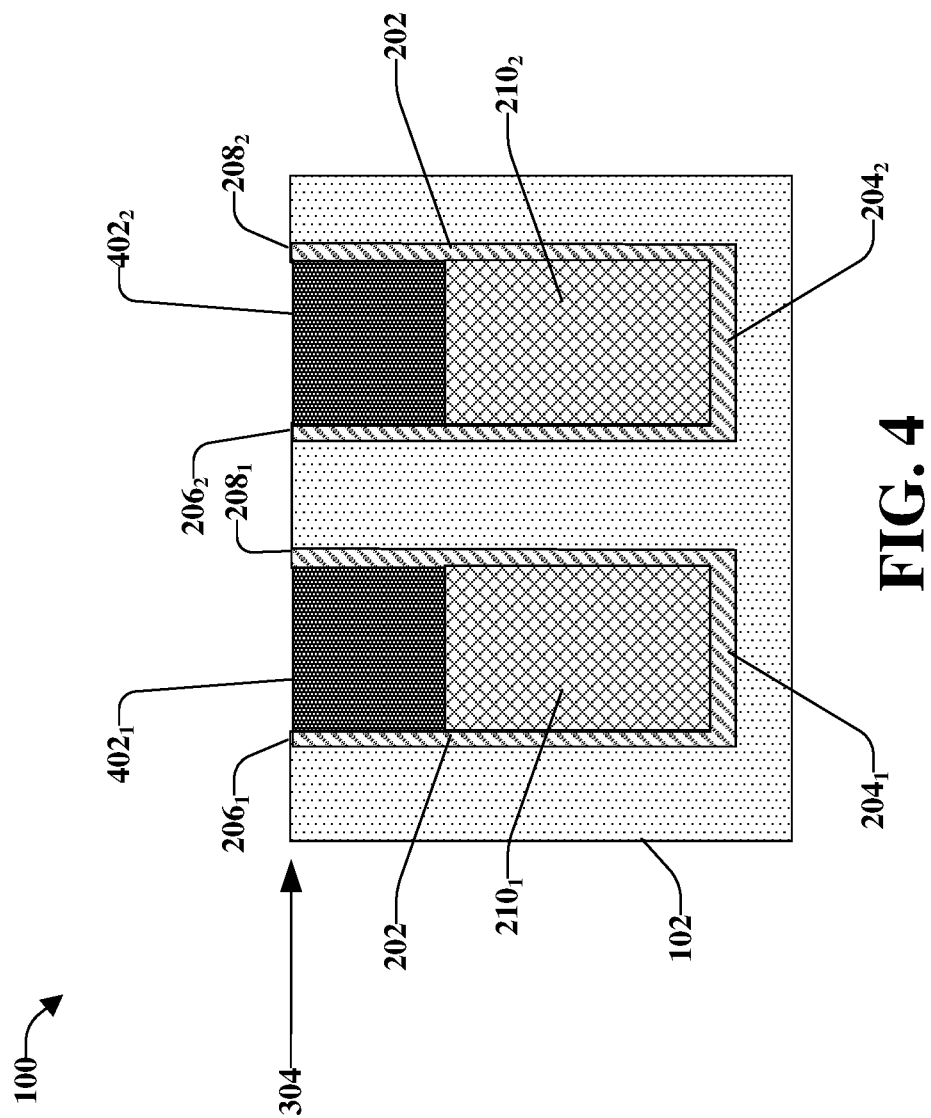
FIG. 4 illustrates an example, non-limiting, side cross-sectional view of the structure of the resistive random-access memory device of FIG. 3 during a fabrication process wherein one or more electrodes are formed in accordance with one or more embodiments described herein.

FIG. 4 illustrates an example, non-limiting, side cross-sectional view of the structure of the resistive random-access memory device 100 of FIG. 3 during a fabrication process wherein one or more electrodes (e.g., bottom electrodes) are formed in accordance with one or more embodiments described herein. Repetitive description of like elements employed in other embodiments described herein is omitted for sake of brevity.

As illustrated, a first electrode $402_1$ can be formed in the first area $302_1$ (e.g., within the first trench $104_1$). Further, a second electrode $402_2$ can be formed in the second area $302_2$ (e.g., within the second trench $104_2$). Accordingly, the first electrode $402_1$ can be formed in the first trench $104_1$ of the dielectric layer and the second electrode $402_2$ can be formed in the second trench $104_2$) of the first dielectric layer 102. According to some implementations, the first electrode $402_1$ and the second electrode $402_2$ can comprise titanium nitrogen (TiN). Further, the first electrode $402_1$ and the second electrode $402_2$ can be referred to as bottom electrodes (e.g., a first bottom electrode, a second bottom electrode).

In further detail, the first electrode $402_1$ can be formed over the first metal line $210_1$. Further, the first electrode $402_1$ can be formed adjacent to the barrier metal layer 202 (within the first trench $104_1$ at the first area $302_1$) at a top portion of the first side $206_1$ and a top portion of the second side $208_1$, exposed when the first metal line $210_1$ is recessed. The second electrode $402_2$ can be formed over the second metal line $210_2$. Further, the second electrode $402_2$ can be formed adjacent the barrier metal layer 202 (within the second trench $104_2$ at the second area $302_2$) at a top portion of the first side $206_2$ and a top portion of the second side $208_2$, exposed when the second metal line $210_2$ is recessed.

Upon or after the first electrode $402_1$ and the second electrode $402_2$ are formed, a CMP process (or a similar process) can be performed on the top surfaces of the first dielectric layer 102, the barrier metal layer 202, the first electrode $402_1$, and the second electrode $402_2$.

Figure 5:
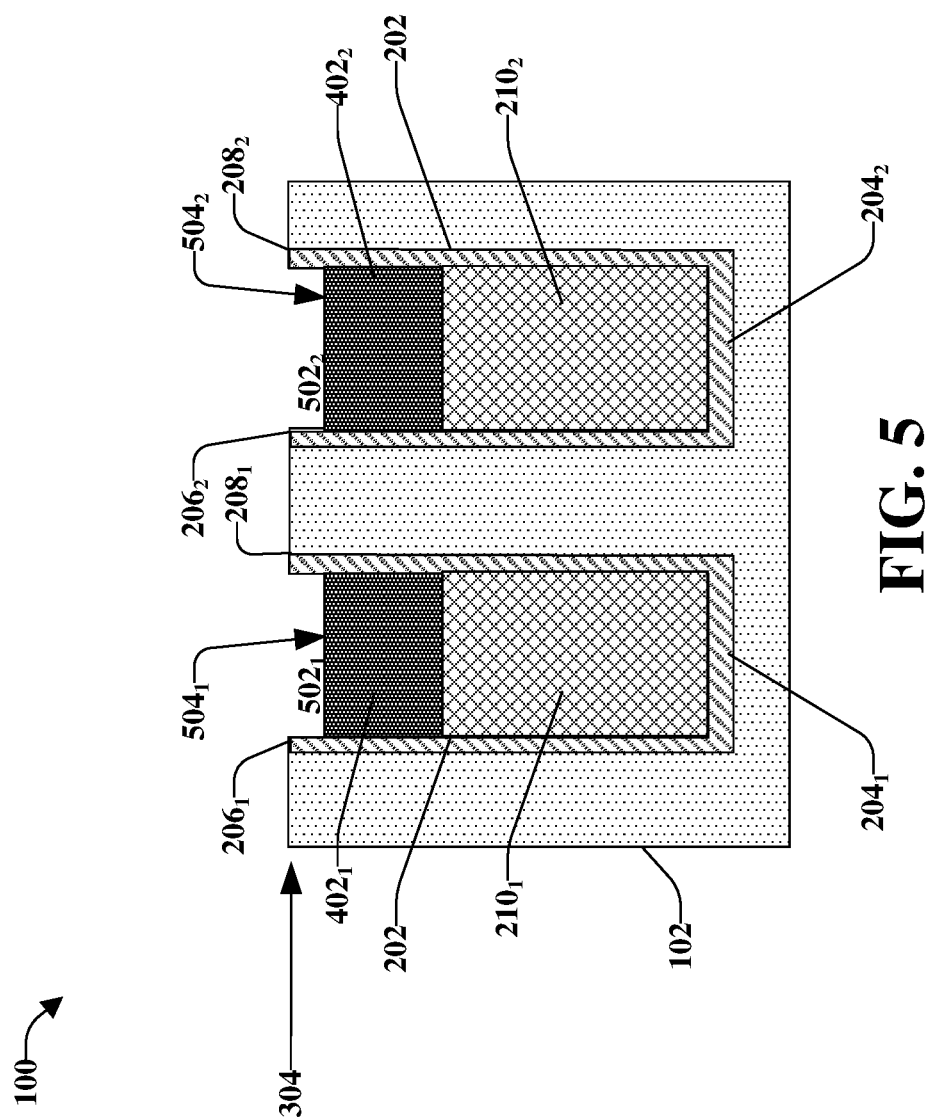
FIG. 5 illustrates an example, non-limiting, side cross-sectional view of the structure of the resistive random-access memory device of FIG. 4 during a fabrication process wherein one or more electrodes are recessed in accordance with one or more embodiments described herein.

FIG. 5 illustrates an example, non-limiting, side cross-sectional view of the structure of the resistive random-access memory device 100 of FIG. 4 during a fabrication process wherein one or more electrodes are recessed in accordance with one or more embodiments described herein. Repetitive description of like elements employed in other embodiments described herein is omitted for sake of brevity.

As illustrated the one or more electrodes (e.g., the first electrode $402_1$, the second electrode $402_2$) can be recessed within respective trenches (e.g., the first trench $104_1$ and the second trench $104_2$). For example, the first electrode $402_1$ can be recessed to create a first recessed portion $502_1$ between the top surface 304 of the resistive random-access memory device 100 and a third defined point $504_1$. Further, the second electrode $402_2$ can be recessed to create a second recessed portion $502_2$ between the top surface 304 of the resistive random-access memory device 100 and a fourth defined point $504_2$.

As illustrated, the first recessed portion $502_1$ can be created over the first electrode $402_1$ and the second recessed portion $502_2$ can be created over the second electrode $402_2$. Thus, material of the first electrode $402_1$ located between the top surface 304 of the resistive random-access memory device 100 and the third defined point $504_1$ can be removed, as indicated by the first recessed portion $502_1$. Further, material of the second electrode $402_2$ located between the top surface 304 of the resistive random-access memory device 100 and the fourth defined point $504_2$ can be removed, as indicated by the second recessed portion $502_2$.

Figure 6:
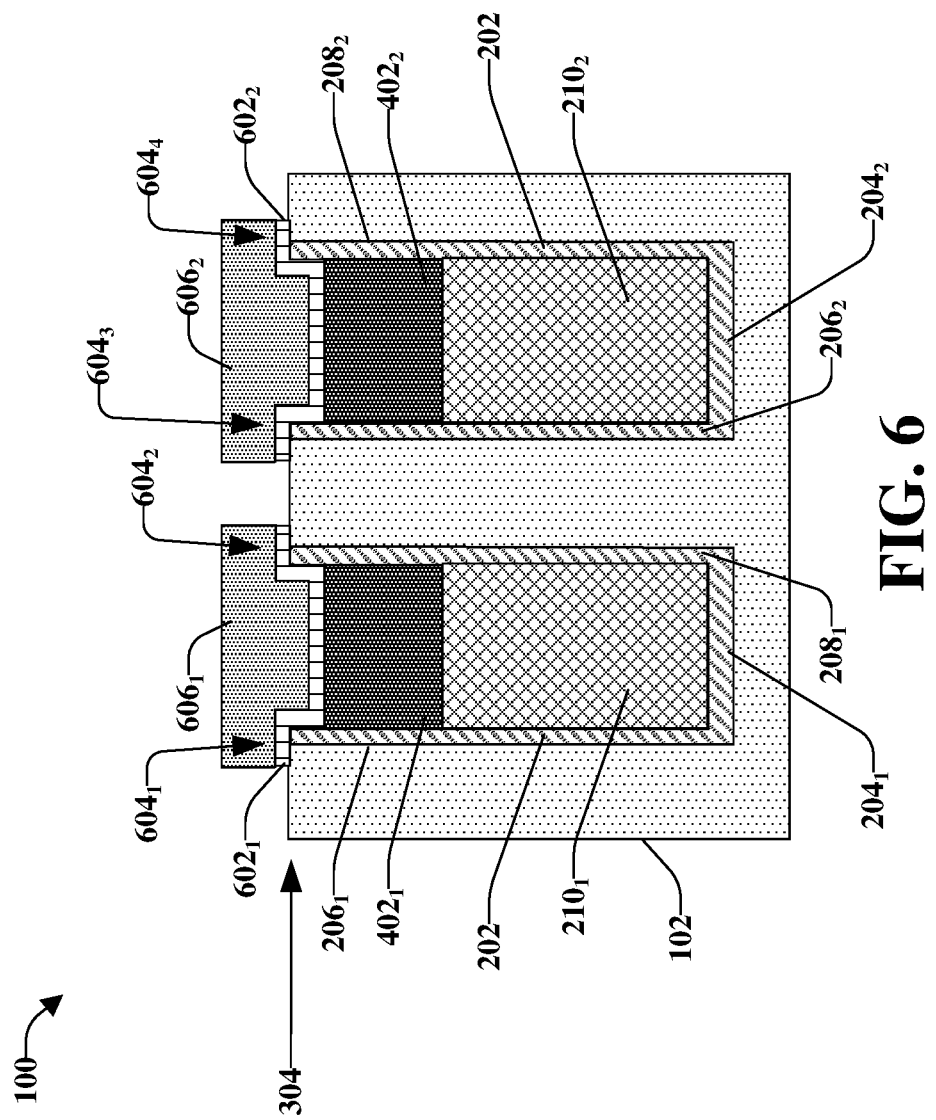
FIG. 6 illustrates an example, non-limiting, side cross-sectional view of the structure of the resistive random-access memory device of FIG. 5 during a fabrication process wherein one or more additional electrodes are deposited in accordance with one or more embodiments described herein.

FIG. 6 illustrates an example, non-limiting, side cross-sectional view of the structure of the resistive random-access memory device 100 of FIG. 5 during a fabrication process wherein one or more additional electrodes (e.g., top electrodes) are deposited in accordance with one or more embodiments described herein. Repetitive description of like elements employed in other embodiments described herein is omitted for sake of brevity.

Metal oxide can be deposited over the electrodes (e.g., the first electrode $402_1$, the second electrode $402_2$). According to some implementations, the metal oxide can comprise a material selected from a group of materials comprising Hafnium Oxide (HfOx), Tantalum Oxide (TaOx), Aluminum Oxide (AlOx), Zirconium Oxide (ZrOx), and Titanium Oxide (TiOx), and their mixtures.

In an example, the metal oxide can comprise a first section $602_1$ that can be located within the first recessed portion $502_1$ of the first electrode $402_1$ (or the first trench $104_1$). Further the first section $602_1$ of the metal oxide can be located over and adjacent the barrier metal layer 202 (as indicated at $604_1$ and $604_2$). The metal oxide can also comprise a second section $602_2$ that can be located within the second recessed portion $502_2$ of the second electrode $402_2$ (or the second trench 1042). Further the second section $602_2$ of the metal oxide can be located over and adjacent the barrier metal layer 202 (as indicated at $604_3$ and $604_4$).

Upon or after forming the metal oxide, electrodes can be deposited on the resistive random-access memory device 100. For example, a third electrode 6061 can be deposited over and adjacent the first section $602_1$ of the metal oxide (and over the first electrode $402_1$). Further, a fourth electrode $606_2$ can be deposited over and adjacent the second section $602_2$ of the metal oxide (and over the second electrode $402_2$). The third electrode $606_1$ and the fourth electrode $606_2$ can be referred to as top electrodes (e.g., a first top electrode, a second top electrode).

Respective one or more corner regions can be present in the metal oxide layer (e.g., the first section $602_1$ of metal oxide, the second section $602_2$ of metal oxide) between the bottom electrodes (e.g., the first electrode $402_1$, the second electrode $402_2$) and the top electrodes (e.g., the third electrode $606_1$, the fourth electrode $606_2$). For example, the one or more corner regions can be based on the recessing the area of the bottom electrode prior to the depositing the metal oxide layer. The one or more corner regions will be discussed in further detail with respect to FIG. 10 below.

Upon or after depositing the third electrode $606_1$ and the fourth electrode $606_2$, lithography and Reactive Ion Etching (RIE) processes can be performed. The lithography and RIE processes can define one or more resistive random-access memory cells.

Figure 7:
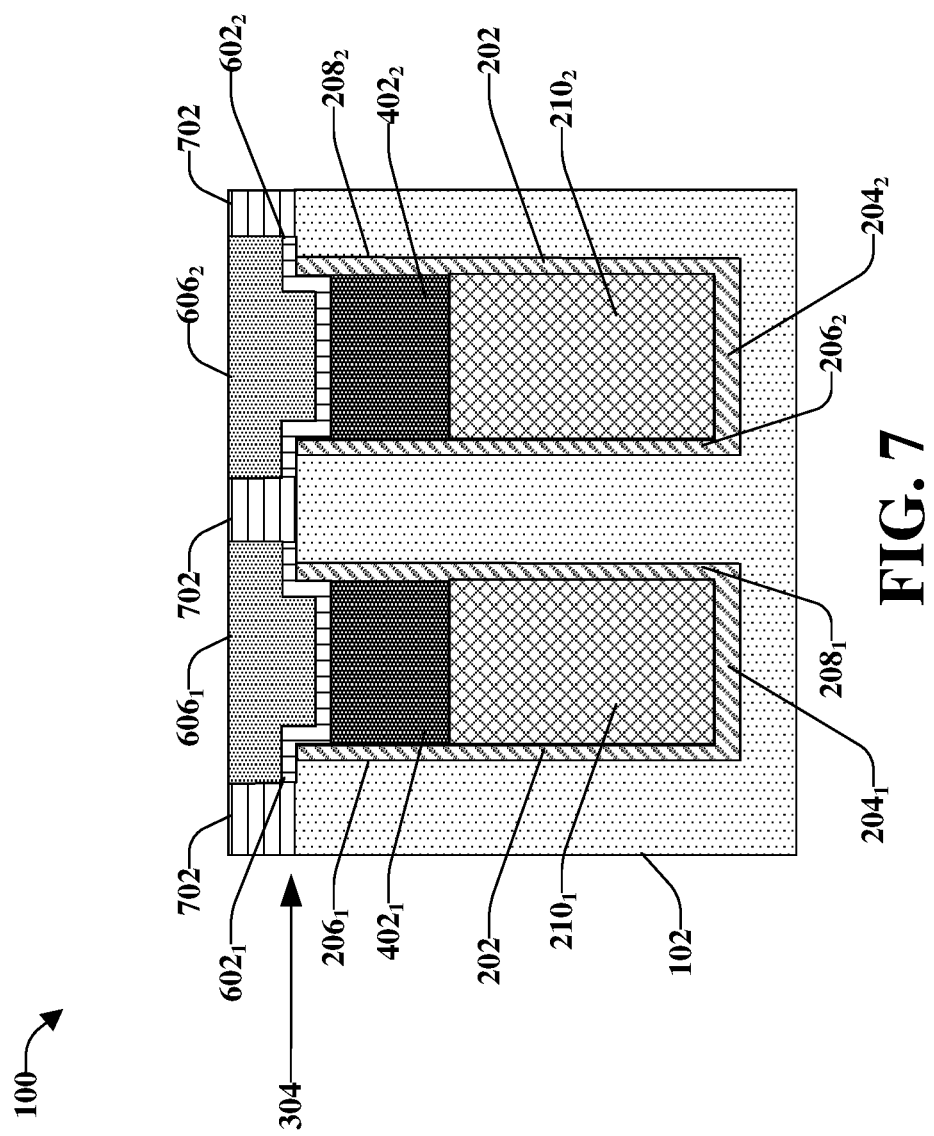
FIG. 7 illustrates an example, non-limiting, side cross-sectional view of the structure of the resistive random-access memory device of FIG. 6 during a fabrication process wherein a second dielectric layer is deposited in accordance with one or more embodiments described herein.

FIG. 7 illustrates an example, non-limiting, side cross-sectional view of the structure of the resistive random-access memory device 100 of FIG. 6 during a fabrication process wherein a second dielectric layer is deposited in accordance with one or more embodiments described herein. Repetitive description of like elements employed in other embodiments described herein is omitted for sake of brevity.

A second dielectric layer 702 can be deposited over the top surface 304. second dielectric layer 702 can be deposited such that the second dielectric layer 702 fills the areas around the third electrode $606_1$ and the fourth electrode $606_2$.

According to some implementations, upon or after deposition of the second dielectric layer 702, CMP can be performed. For example, CMP can be performed over a top surface of the third electrode $606_1$, the fourth electrode $606_2$, and the second dielectric layer 702.

Figure 8:
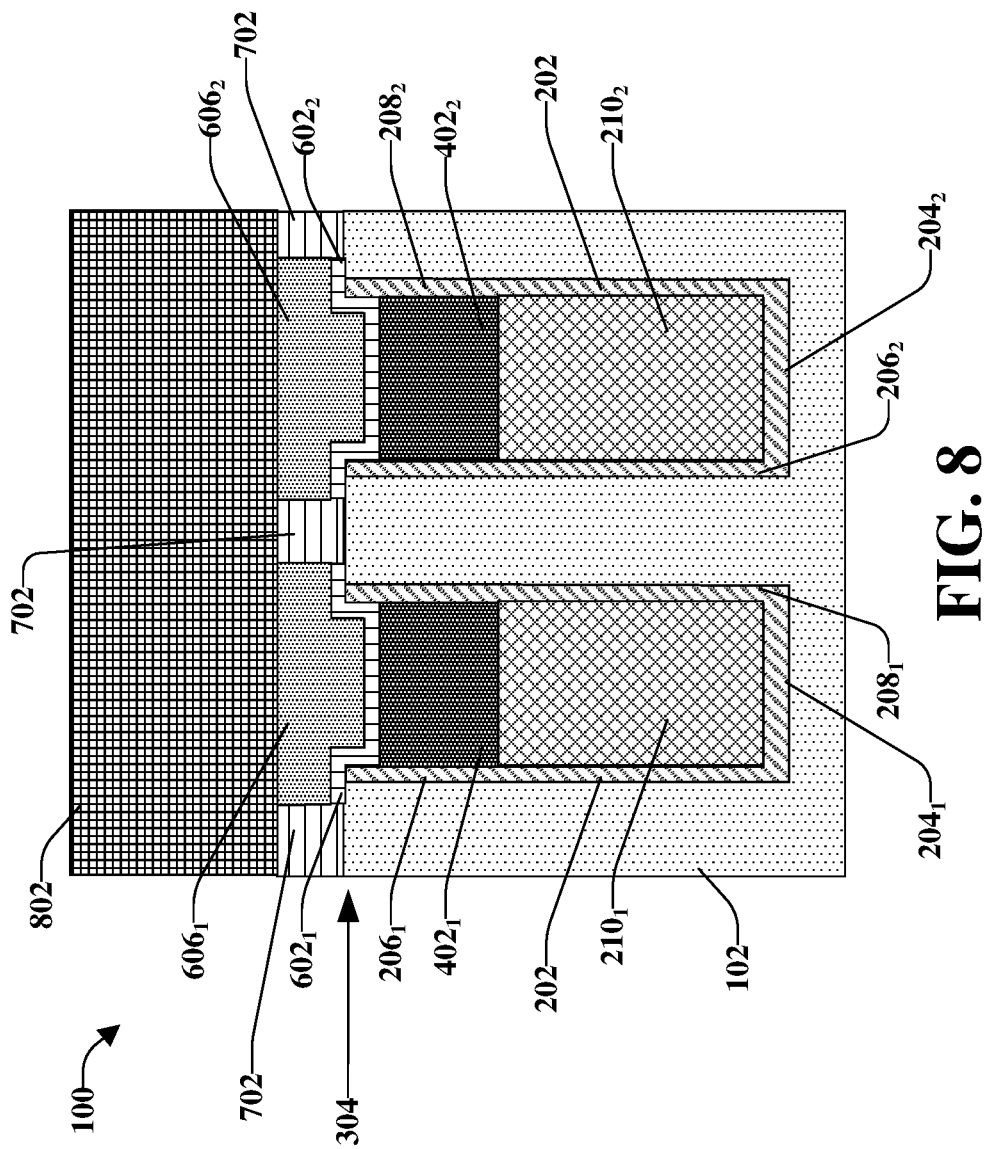
FIG. 8 illustrates an example, non-limiting, side cross-sectional view of the structure of the resistive random-access memory device of FIG. 7 during a fabrication process wherein a second metal line is formed in accordance with one or more embodiments described herein.

FIG. 8 illustrates an example, non-limiting, side cross-sectional view of the structure of the resistive random-access memory device 100 of FIG. 7 during a fabrication process wherein a second metal line is formed in accordance with one or more embodiments described herein. Repetitive description of like elements employed in other embodiments described herein is omitted for sake of brevity.

A third metal line 802 can be formed over the top surface of the third electrode $606_1$, the fourth electrode $606_2$, and the second dielectric layer 702. According to some implementations, the third metal line can comprise copper (Cu).

Figure 9:
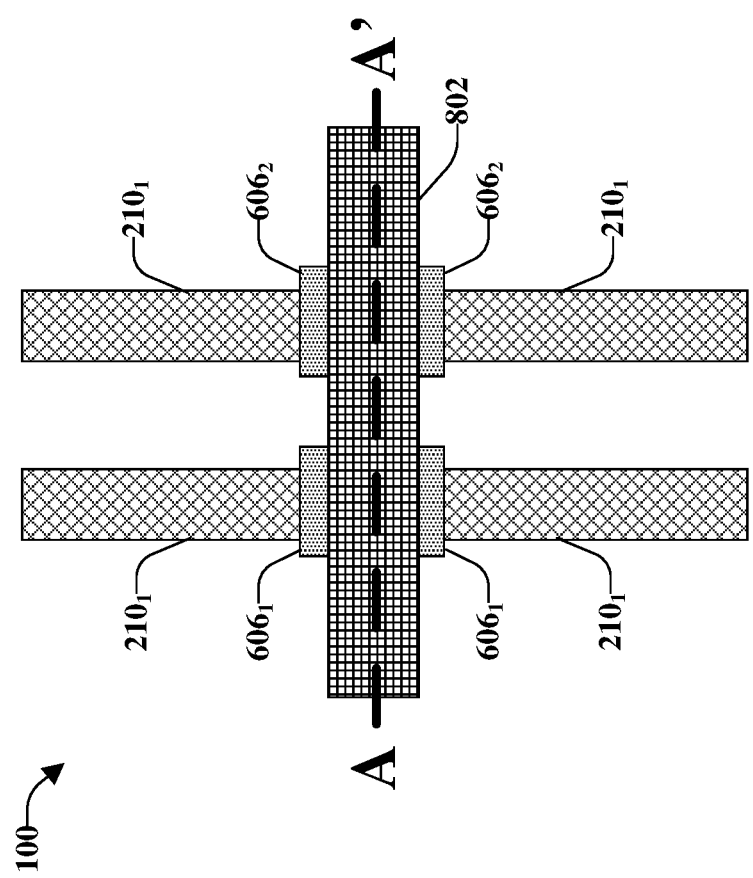
FIG. 9 illustrates an example, non-limiting, top view of a resistive random-memory device structure in accordance with one or more embodiments described herein.

FIG. 9 illustrates an example, non-limiting, top view of a resistive random-access memory device structure 900 in accordance with one or more embodiments described herein. Repetitive description of like elements employed in other embodiments described herein is omitted for sake of brevity.

As illustrated, from the top view, the first metal line $210_1$, the second metal line $210_2$ and the third metal line 802 can be viewed from the top of the resistive random-access memory device 100. Further, the top electrodes (e.g., the third electrode $606_1$, the fourth electrode $606_2$), which form the resistive random-access memory cells can also be viewed from the top of the resistive random-access memory device 100.

Figure 10:
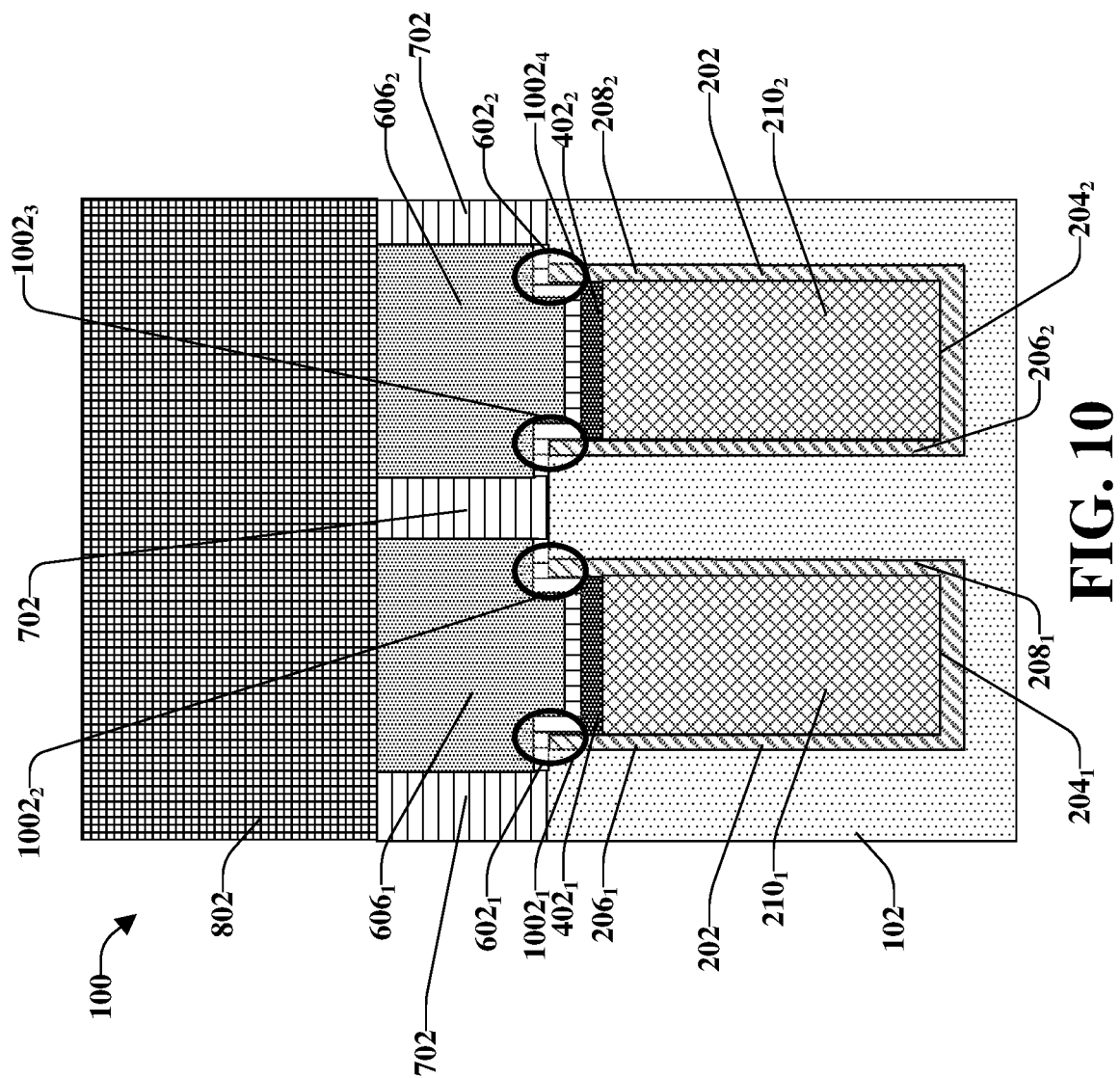
FIG. 10 illustrates an example, non-limiting, cross-sectional view of the resistive random-access memory device structure of FIG. 9 taken along line A-A', in accordance with one or more embodiments described herein.

FIG. 10 illustrates an example, non-limiting, cross-sectional view of the resistive random-access memory device structure 900 of FIG. 9 taken along line A-A', in accordance with one or more embodiments described herein. Repetitive description of like elements employed in other embodiments described herein is omitted for sake of brevity.

As illustrated, the resistive random-access memory device structure can comprise, an electric field that can be enhanced at one or more corners of the top electrode (e.g., the third electrode $606_1$, the fourth electrode $606_2$). The one or more corners are depicted within the circles $1002_1$, $1002_2$, $1002_3$, and $1002_4$. The one or more corners (e.g., corner regions) can be present in the metal oxide layer (e.g., the first section $602_1$ of the metal oxide layer, the second section $602_2$ of the metal oxide layer) between the top electrodes (e.g., the third electrode $606_1$, the fourth electrode $606_2$) and the bottom electrodes (e.g., the first electrode $402_1$, the second electrode $402_2$). According to some implementations, the metal oxide layer can comprise a resistive random-access memory device switching element.

Further, a presence of the one or more corner regions in the metal oxide layer between the bottom electrode and the top electrode can enhance a localized electrical field of the resistive random-access memory device structure 900. The electrodes (e.g., the first electrode $402_1$, the second electrode $402_2$, the third electrode $606_1$, the fourth electrode $606_2$) can comprise one or more corners that can comprise an under-convex shape. For example, the under-convex shape is opposite an upward-convex shape. In accordance with some implementations, the bottom electrode (e.g., the first electrode $402_1$, the second electrode $402_2$) has a topography (three-dimensional shape) to concentrate electrical field for the lower forming voltage According to some implementations, the electrodes (e.g., the first electrode $402_1$, the second electrode $402_2$, the third electrode $606_1$, the fourth electrode $606_2$) can comprise a three-dimensional shape.

Figure 11:
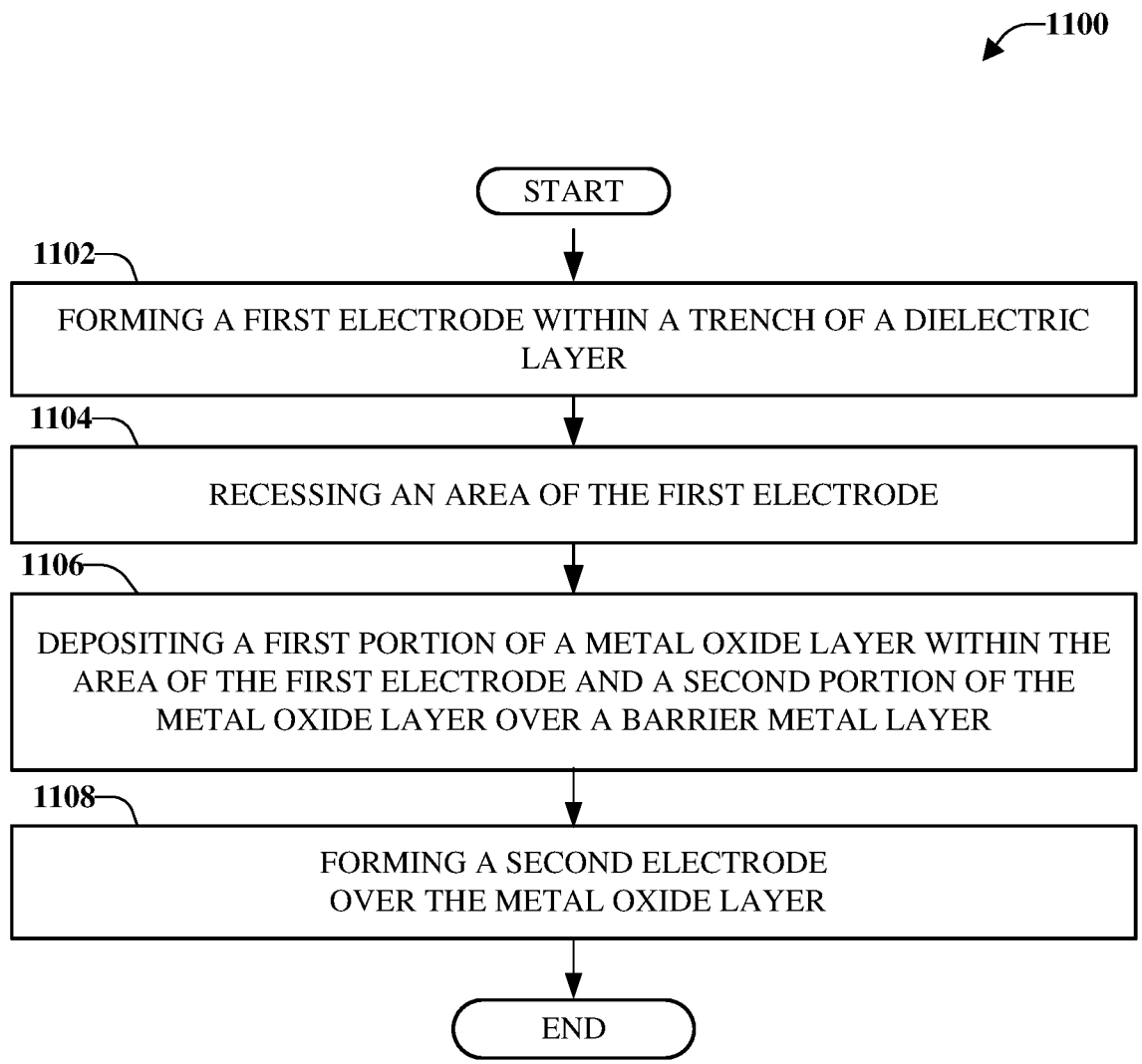
FIG. 11 illustrates a flow diagram of an example, non-limiting, method that facilitates fabrication of a resistive random-access memory device with step height difference in accordance with one or more embodiments described herein.

FIG. 11 illustrates a flow diagram of an example, non-limiting, method 1100 that facilitates fabrication of a resistive random-access memory device with step height difference in accordance with one or more embodiments described herein. Repetitive description of like elements employed in other embodiments described herein is omitted for sake of brevity.

The method 1100 starts, at 1102, when a first electrode or top electrode (e.g., the first electrode $402_1$, the second electrode $402_2$) can be formed in a trench (e.g., the first trench $104_1$ and the second trench $104_2$) of a dielectric layer (e.g., the first dielectric layer 102). In accordance with an implementation, forming the first electrode can comprise forming the first electrode with a topography that concentrates an electrical field for a lower forming voltage. According to some implementations, forming the first electrode can comprise forming a three-dimensional shaped first electrode in the trench of the dielectric layer.

Upon or after the formation of the electrode, at 1104 of the method 1100, an area (e.g., the first area $302_1$, the second area $302_2$) of the first electrode can be recessed. For example, recessing the first area can comprise removing a portion of the trench from a top surface 304 of the resistive random-access memory device 100 to a defined point (e.g., the first defined point $306_1$, the second defined point $306_2$).

At 1106 of the method 1100, a first portion of a metal oxide layer (e.g., the first section $602_1$ of metal oxide, the second section $602_2$ of metal oxide) can be deposited within the area of the first electrode (e.g., within the trench). Further, a second portion of the metal oxide layer (e.g., as indicated at $604_1$ and $604_2$, as indicated at $604_3$ and $604_4$) can be deposited over a barrier metal layer (e.g., the barrier metal layer 202). According to some implementations, the second portion of the metal oxide layer can also be deposited adjacent the barrier metal layer.

Further, at 1108 of the method 1100, a second electrode or top electrode (e.g., the third electrode $606_1$, the fourth electrode $606_2$) can be formed over the metal oxide layer. According to some implementations, the second electrode can also be formed adjacent the metal oxide layer.

According to some implementations, one or more corner regions can be present in the metal oxide layer between the first electrode and the second electrode. For example, the one or more corner regions can be formed based on recessing the area of the first electrode (e.g., at 1106 of the method 1100) prior to depositing the metal oxide layer (e.g., at 1108 of the method 1100). In an example, having the one or more corner regions present in the metal oxide layer between the first electrode and the second electrode can enhance a localized electrical field. According to some implementations, a forming voltage can be reduced by around 0.5 volts using resistive random-access memory devices with step height differences as discussed herein.

Figure 12:
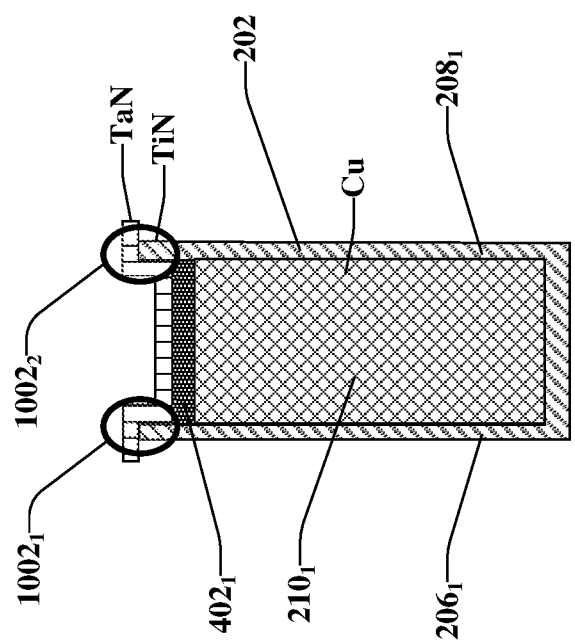
FIG. 12 illustrates an example, non-limiting, side cross-sectional view of a portion of the structure of the resistive random-access memory device of FIG. 10 in accordance with one or more embodiments described herein.

In some implementations, forming the first electrode can comprise forming one or more corners comprising an under-convex-shape. In accordance with some implementations, forming the first electrode can comprise forming one or more corners using chemical mechanical processing and wet etch processes. For example, FIG. 12 illustrates an example, non-limiting, side cross-sectional view of a portion of the structure of the resistive random-access memory device 100 of FIG. 10 in accordance with one or more embodiments described herein. As illustrated, the one or more corners (e.g., depicted within the circles $1002_1$ and $1002_2$ of FIG. 10) can comprise the under-convex shape. Thus, the under-convex shape electrode can include TaN and TiN on Cu. According to some implementations, this can determine the location of the resistive random-access memory cell because it is self aligned.

As discussed herein, provided is a device that comprises a recessed bottom electrode from the level of the dielectric layer (e.g., ILD). A metal oxide layer (e.g., Hafnium Oxide (HfOx), Tantalum Oxide (TaOx), Aluminum Oxide (AlOx), Zirconium Oxide (ZrOx) and Titanium Oxide (TiOx) and their mixtures) and a top electrode layer can be formed on the recessed portion of the bottom electrode. Further, respective resistive random-access memory cells can comprise corners in the disclosed structure (e.g., filament formation).

Figure 13:
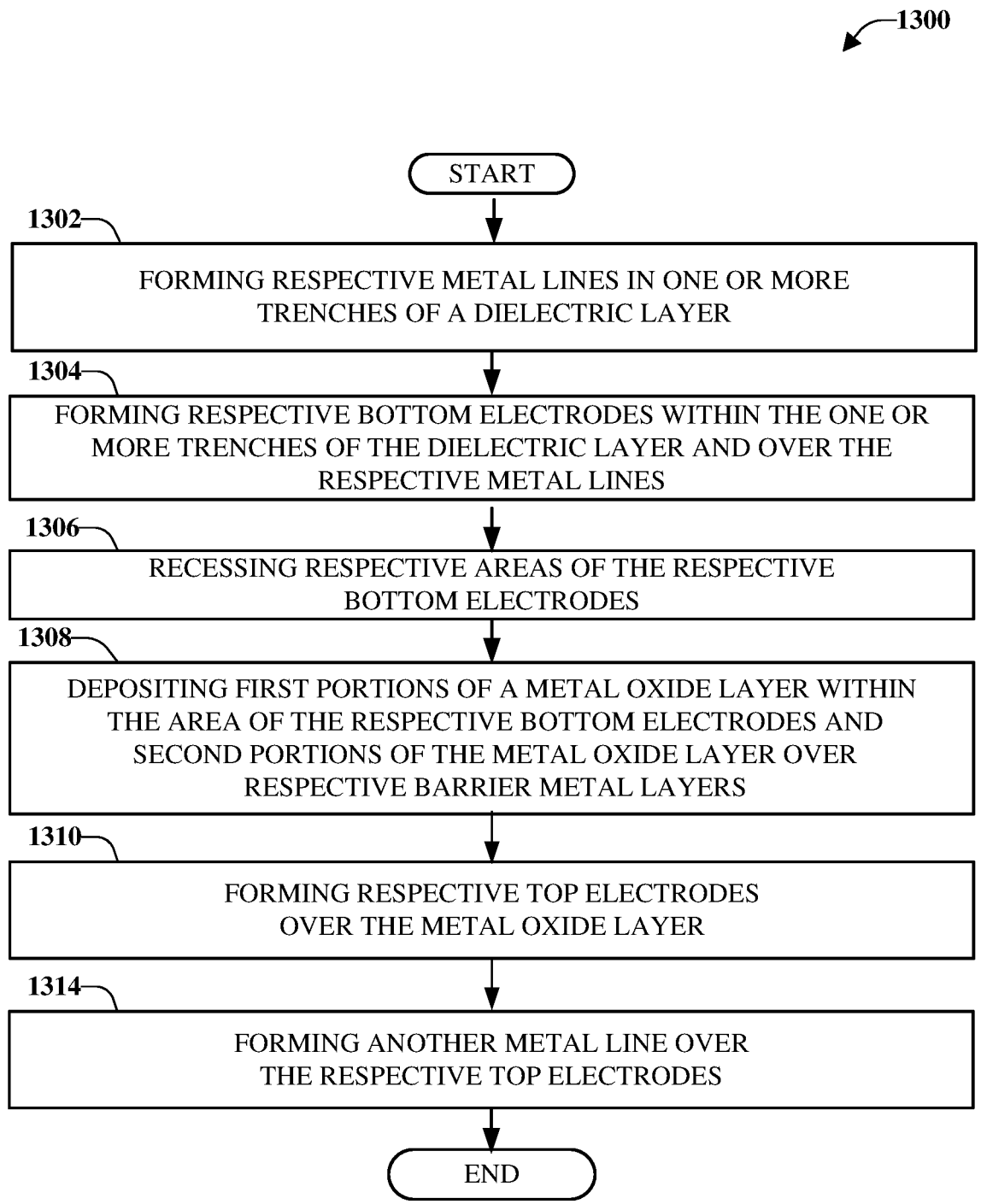
FIG. 13 illustrates a flow diagram of another example, non-limiting, method that facilitates fabrication of a resistive random-access memory device with step height difference in accordance with one or more embodiments described herein.

FIG. 13 illustrates a flow diagram of another example, non-limiting, method 1300 that facilitates fabrication of a resistive random-access memory device with step height difference in accordance with one or more embodiments described herein. Repetitive description of like elements employed in other embodiments described herein is omitted for sake of brevity.

At 1302 of the method 1300, respective metal lines (e.g., the first metal line $210_1$, the second metal line $210_2$) can be formed in one or more trenches (e.g., the first trench $104_1$, the second trench $104_2$) of a dielectric layer (e.g., the first dielectric layer 102) of a resistive random-access memory device (e.g., the resistive random-access memory device 100). Further, one or more bottom electrodes (e.g., the first electrode $402_1$, the second electrode $402_2$) can be formed, at 1304 of the method, within the one or more trenches of the dielectric layer and over the respective metal lines.

At 1306 of the method 1300, respective areas (e.g., the first area $302_1$, the second area $302_2$) of the respective bottom electrodes can be recessed. For example, the respective bottom electrodes can be recessed below a surface (e.g., the top surface 304) of the resistive random-access memory device to a defined point (e.g., the first defined point $306_1$, the second defined point $306_2$).

A first portion and a second portion of respective metal oxide layers (e.g., the first section $602_1$ of metal oxide, the second section $602_2$ of metal oxide) can be deposited, at 1308 of the method 1300. For example, a first portion can be deposited within the area of the respective bottom electrodes and the second portion can be deposited over a barrier metal layer (e.g., the barrier metal layer 202 as indicated at $604_1$ and $604_2$ and at $604_3$ and $604_4$ of FIG. 6). According to some implementations, the second portion can also be deposited adjacent the barrier metal layer.

Further, at 1310 of the method 1300, respective top electrodes (e.g., the third electrode $606_1$, the fourth electrode $606_2$) can be formed over the metal oxide layer. According to some implementations, the respective top electrodes can also be formed adjacent the metal oxide layer. At 1312 of the method 1300, another metal line (e.g., the third metal line 802) can be formed over and adjacent the respective top electrodes.

For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device or storage media.

Figure 14:
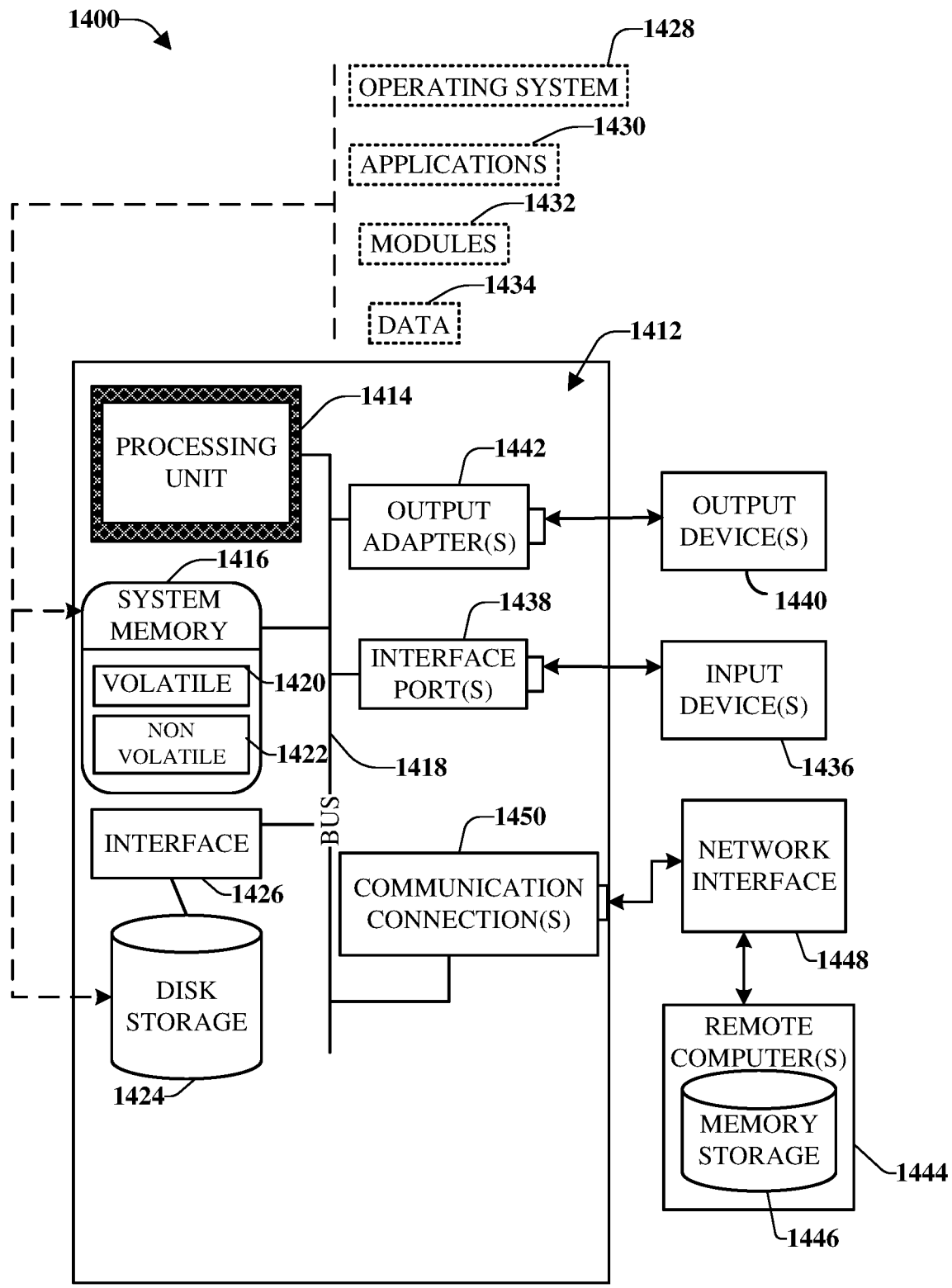
FIG. 14 illustrates a block diagram of an example, non-limiting, operating environment in which one or more embodiments described herein can be facilitated.

In order to provide a context for the various aspects of the disclosed subject matter, FIG. 14 as well as the following discussion are intended to provide a general description of a suitable environment in which the various aspects of the disclosed subject matter can be implemented. FIG. 14 illustrates a block diagram of an example, non-limiting operating environment in which one or more embodiments described herein can be facilitated. Repetitive description of like elements employed in other embodiments described herein is omitted for sake of brevity. With reference to FIG. 14, a suitable operating environment 1400 for implementing various aspects of this disclosure can also include a computer 1412. The computer 1412 can also include a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414. The system bus 1418 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), Video Electronics Standards Association (VESA) Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1416 can also include volatile memory 1420 and nonvolatile memory 1422. The basic input/output system (BIOS), containing the basic routines to transfer information between elements within the computer 1412, such as during start-up, is stored in nonvolatile memory 1422. By way of illustration, and not limitation, nonvolatile memory 1422 can include Read Only Memory (ROM), Programmable ROM (PROM), Electrically Programmable ROM (EPROM), Electrically Erasable Programmable ROM (EEPROM), flash memory, or nonvolatile Random Access Memory (RAM) (e.g., Ferroelectric RAM (FeRAM)). Volatile memory 1420 can also include RAM, which acts as external cache memory. By way of illustration and not limitation, RAM is available in many forms such as Static RAM (SRAM), Dynamic RAM (DRAM), Synchronous DRAM (SDRAM), Double Data Rate SDRAM (DDR SDRAM), Enhanced SDRAM (ESDRAM), Synchlink DRAM (SLDRAM), Direct Rambus RAM (DRRAM), direct Rambus dynamic RAM (DRDRAM), and Rambus dynamic RAM.

Computer 1412 can also include removable/non-removable, volatile/non-volatile computer storage media. FIG. 14 illustrates, for example, a disk storage 1424. Disk storage 1424 can also include, but is not limited to, devices like a magnetic disk drive, floppy disk drive, tape drive, Jaz drive, Zip drive, LS-100 drive, flash memory card, or memory stick. The disk storage 1424 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1424 to the system bus 1418, a removable or non-removable interface is typically used, such as interface 1426. FIG. 14 also depicts software that acts as an intermediary between users and the basic computer resources described in the suitable operating environment 1400. Such software can also include, for example, an operating system 1428. Operating system 1428, which can be stored on disk storage 1424, acts to control and allocate resources of the computer 1412. System applications 1430 take advantage of the management of resources by operating system 1428 through program modules 1432 and program data 1434, e.g., stored either in system memory 1416 or on disk storage 1424. It is to be appreciated that this disclosure can be implemented with various operating systems or combinations of operating systems. A user enters commands or information into the computer 1412 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB). Output device(s) 1440 use some of the same type of ports as input device(s) 1436. Thus, for example, a USB port can be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a method of connection between the output device 1440 and the system bus 1418. It should be noted that other devices and/or systems of devices provide both input and output capabilities such as remote computer(s) 1444.

Computer 1412 can operate in a networked environment using logical connections to one or more remote computers, such as remote computer(s) 1444. The remote computer(s) 1444 can be a computer, a server, a router, a network PC, a workstation, a microprocessor based appliance, a peer device or other common network node and the like, and typically can also include many or all of the elements described relative to computer 1412. For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1450 refers to the hardware/software employed to connect the network interface 1448 to the system bus 1418. While communication connection 1450 is shown for illustrative clarity inside computer 1412, it can also be external to computer 1412. The hardware/software for connection to the network interface 1448 can also include, for exemplary purposes only, internal and external technologies such as, modems including regular telephone grade modems, cable modems and DSL modems, ISDN adapters, and Ethernet cards.

The present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include ROM, PROM, EPROM, EEPROM, flash memory, or nonvolatile RAM (e.g., FeRAM. Volatile memory can include RAM, which can act as external cache memory, for example. Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming a first electrode within a trench of a dielectric layer, wherein the first electrode has a maximum width that is less than a width of the trench and does not extend beyond the width of the trench;
   recessing an area of the first electrode;
   depositing a first portion of a metal oxide layer within the area of the first electrode and directly adjacent a sidewall of a barrier metal layer within the trench, and depositing a second portion of the metal oxide layer over and directly adjacent the barrier metal layer; and
   forming a second electrode directly adjacent and over the metal oxide layer, wherein a maximum width of the second electrode is greater than the width of the trench.

2. The method of claim 1, wherein one or more corner regions are present in the metal oxide layer between the first electrode and the second electrode based on the recessing the area of the first electrode prior to the depositing the metal oxide layer.

3. The method of claim 1, further comprising:
   enhancing a localized electrical field as a function of one or more corner regions being present in the metal oxide layer between the first electrode and the second electrode.

4. The method of claim 1, wherein the forming the first electrode comprises forming one or more corners comprising an under-convex-shape.

5. The method of claim 1, wherein the forming the first electrode comprises forming a three-dimensional shaped first electrode in the trench of the dielectric layer.

6. The method of claim 1, wherein the forming the first electrode comprises forming one or more corners using chemical mechanical processing and wet etch processes.

7. The method of claim 1, wherein the trench is a three-sided trench and wherein the barrier metal layer is a three sided barrier metal layer.

* * * * *